US010685916B2

(12) United States Patent
Shin et al.

(10) Patent No.: US 10,685,916 B2
(45) Date of Patent: Jun. 16, 2020

(54) FAN-OUT SEMICONDUCTOR PACKAGE

(71) Applicant: SAMSUNG ELECTRONICS CO., LTD., Suwon-si (KR)

(72) Inventors: Seung Wan Shin, Suwon-si (KR); Ho Jun Jung, Suwon-si (KR); Seung Chul Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/285,596

(22) Filed: Feb. 26, 2019

(65) Prior Publication Data

US 2020/0075487 A1 Mar. 5, 2020

(30) Foreign Application Priority Data

Aug. 28, 2018 (KR) .......................... 10-2018-0101264

(51) Int. Cl.
*H01L 23/52* (2006.01)
*H01L 21/56* (2006.01)
(Continued)

(52) U.S. Cl.
CPC ........ *H01L 23/5283* (2013.01); *H01L 21/563* (2013.01); *H01L 23/3128* (2013.01);
(Continued)

(58) Field of Classification Search
CPC ......... H01L 24/73; H01L 24/32; H01L 24/17; H01L 24/09; H01L 23/31; H01L 23/312;
(Continued)

(56) References Cited

U.S. PATENT DOCUMENTS 9,330,947 B2 5/2016 Hu et al.
9,847,315 B2 12/2017 Lin et al.
(Continued)

FOREIGN PATENT DOCUMENTS

KR 10-2016-0029648 A 3/2016
KR 10-2017-0071826 A 6/2017
KR 10-2018-0020849 A 2/2018

OTHER PUBLICATIONS

Communication dated Nov. 9, 2019, issued by the Korean Patent Office in counterpart Korean Application No. 10-2018-0101264.

*Primary Examiner* — Monica D Harrison
(74) *Attorney, Agent, or Firm* — Sughrue Mion, PLLC

(57) ABSTRACT

A fan-out semiconductor package includes a frame comprising wiring layers, and a dummy layer, and having a recessed portion on a bottom surface on which a stopper layer is disposed; a semiconductor chip disposed in the recessed portion such that an inactive surface opposes the stopper layer; a first interconnect structure disposed on the connection pad; a second interconnect structure disposed on the outermost wiring layer; a dummy structure disposed on the dummy layer; an encapsulant encapsulating at least portions of the frame, the semiconductor chip, the first interconnect structure, the second interconnect structure, and the dummy structure, and filling at least a portion of the recessed portion; and a connection member disposed on the frame and an active surface of the semiconductor chip, and comprising a redistribution layer electrically connected to first and second metal bumps. The dummy structure has sloped side surfaces.

17 Claims, 19 Drawing Sheets

(51) Int. Cl.
   *H01L 23/528* (2006.01)
   *H01L 23/00* (2006.01)
   *H01L 23/31* (2006.01)
   *H01L 23/522* (2006.01)

(52) U.S. Cl.
   CPC .......... *H01L 23/5226* (2013.01); *H01L 24/09* (2013.01); *H01L 24/17* (2013.01); *H01L 24/32* (2013.01); *H01L 24/73* (2013.01); *H01L 2224/0231* (2013.01); *H01L 2224/02373* (2013.01); *H01L 2224/02377* (2013.01); *H01L 2224/02379* (2013.01); *H01L 2224/02381* (2013.01); *H01L 2224/73253* (2013.01); *H01L 2924/15311* (2013.01)

(58) Field of Classification Search
   CPC ... H01L 23/3128; H01L 23/52; H01L 23/522; H01L 23/5226; H01L 23/528; H01L 23/5283; H01L 21/56; H01L 21/563
   USPC .......................................... 257/690
   See application file for complete search history.

(56) References Cited

U.S. PATENT DOCUMENTS

| | | | |
|---|---|---|---|
| 2014/0048951 A1* | 2/2014 | Lin | ............ H01L 23/481 257/774 |
| 2016/0071829 A1 | 3/2016 | Yu et al. | |
| 2018/0053732 A1 | 2/2018 | Baek et al. | |

* cited by examiner a b c

FAN-OUT SEMICONDUCTOR PACKAGE

CROSS-REFERENCE TO RELATED APPLICATION(S)

This application claims benefit of priority to Korean Patent Application No. 10-2018-0101264 filed on Aug. 28, 2018 in the Korean Intellectual Property Office, the disclosure of which is incorporated herein by reference in its entirety.

TECHNICAL FIELD

The present disclosure relates to a semiconductor package, and more particularly, a fan-out semiconductor package in which an electrical interconnect structure may extend outwardly of a region in which a semiconductor chip is disposed.

BACKGROUND

One of major trends in semiconductor chip technology is to reduce the size of components. Accordingly, in the field of semiconductor packages, a semiconductor package has been required to have a reduced size while implementing a plurality of pins in accordance with an increase in consumption of small-sized semiconductor chips.

Among semiconductor package techniques to meet the above demand is a fan-out semiconductor package. In the fan-out semiconductor package, a connection terminal is redistributed outwardly of a region in which a semiconductor chip is disposed such that a semiconductor may have a reduced size while implementing a plurality of pins.

SUMMARY

An aspect of the present disclosure is to provide a fan-out semiconductor package in which a semiconductor chip may be disposed using a frame including a recessed portion having a blind form, and accordingly, when a grinding process is used, a residual thickness of an interconnect structure, electrically connecting a wiring of the frame and/or a connection pad of the semiconductor chip to a redistribution layer, may be measured.

Another aspect of the present disclosure is to provide a fan-out semiconductor package in which a dummy structure or an interconnect structure having sloped side surfaces may be disposed in an outermost portion of a frame.

According to an aspect of the present disclosure, a fan-out semiconductor package includes a frame comprising a plurality of wiring layers electrically connected to one another, and a dummy layer disposed on the same level as a level of an outermost wiring layer among the plurality of wiring layers, and having a recessed portion on a bottom surface on which a stopper layer is disposed; a semiconductor chip having an active surface on which a connection pad is disposed and an inactive surface opposing the active surface, and disposed in the recessed portion such that the inactive surface opposes the stopper layer; a first interconnect structure disposed on the connection pad; a second interconnect structure disposed on the outermost wiring layer; a dummy structure disposed on the dummy layer; an encapsulant encapsulating at least portions of the frame, the semiconductor chip, the first interconnect structure, the second interconnect structure, and the dummy structure, and filling at least a portion of the recessed portion; and a connection member disposed on the frame and on the active surface of the semiconductor chip, and comprising a redistribution layer electrically connected to first and second metal bumps. The dummy structure has sloped side surfaces.

According to another aspect of the present disclosure, a fan-out semiconductor package includes a frame comprising a plurality of wiring layers electrically connected to one another, and having a recessed portion on a bottom surface on which a stopper layer is disposed; a semiconductor chip having an active surface on which a connection pad is disposed and an inactive surface opposing the active surface, and disposed in the recessed portion such that the inactive surface opposes the stopper layer; a first interconnect structure disposed on the connection pad; a second interconnect structure disposed on at least one pattern on an uppermost wiring layer among the plurality of wiring layers; a third interconnect structure disposed on at least the other pattern on the uppermost wiring layer among the plurality of wiring layers; an encapsulant encapsulating at least portions of the frame, the semiconductor chip, the first to third interconnect structures, and filling at least a portion of the recessed portion; and a connection member disposed on the frame and the active surface of the semiconductor chip, and comprising a redistribution layer electrically connected to first and second metal bumps. The third interconnect structure has side surfaces having slopes greater than slopes of side surfaces of the second interconnect structure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
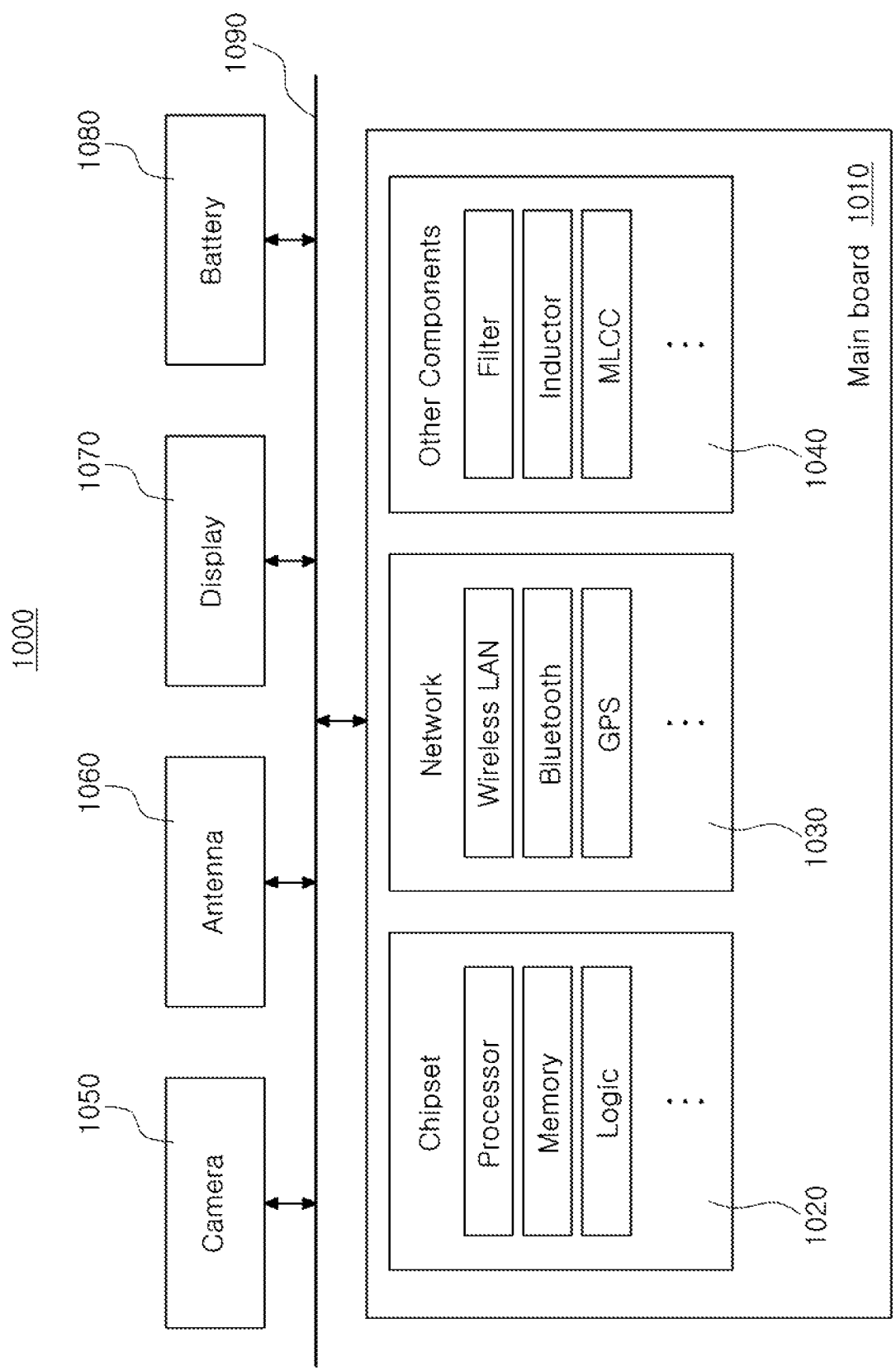
FIG. 1 is a schematic block diagram illustrating an example of an electronic device system.

Hereinafter, exemplary embodiments of the present disclosure will be described with reference to the accompanying drawings.

In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
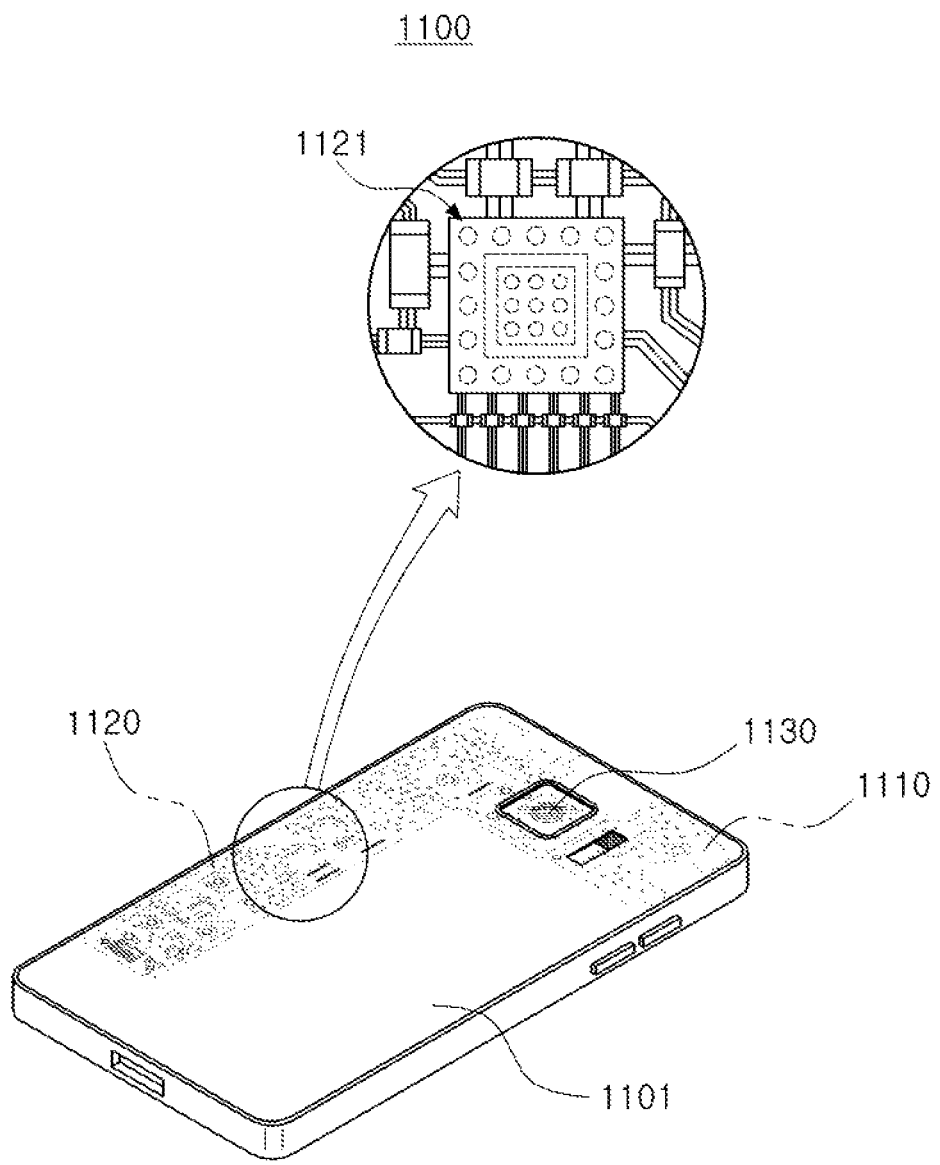
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described in greater detail with reference to the drawings.

Fan-In Semiconductor Package

Figure 3A:
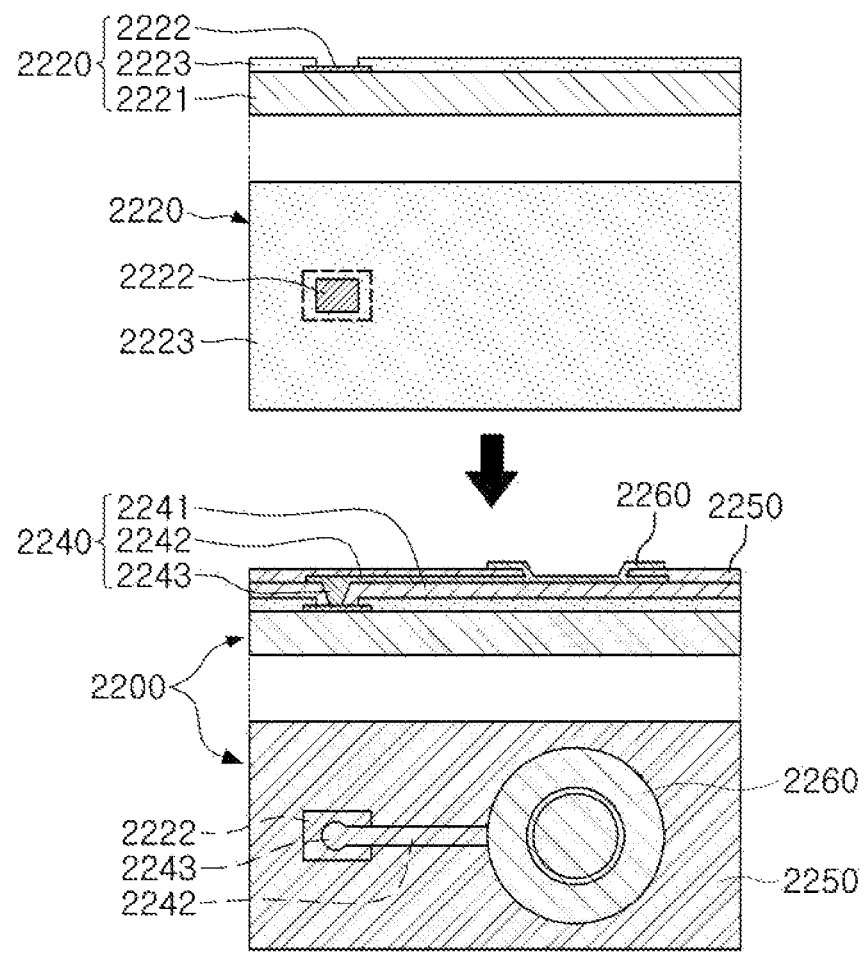
FIGS. 3A and 3B are schematic cross-sectional diagrams illustrating states of a fan-in semiconductor package before and after a packaging process.
Figure 3B:
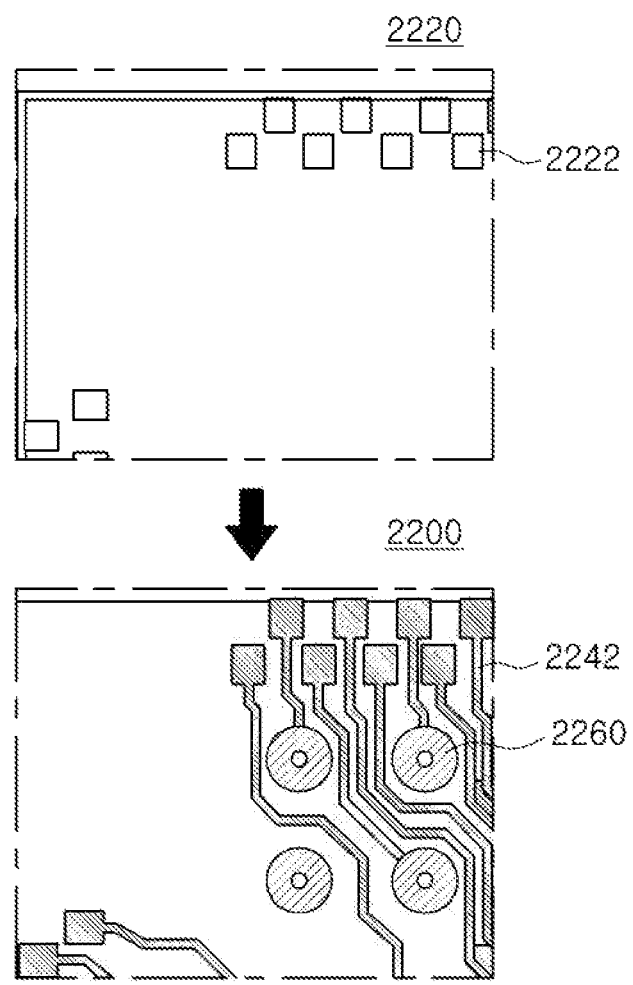

FIGS. 3A and 3B are schematic cross-sectional diagrams illustrating states of a fan-in semiconductor package before and after a packaging process.

Figure 4:
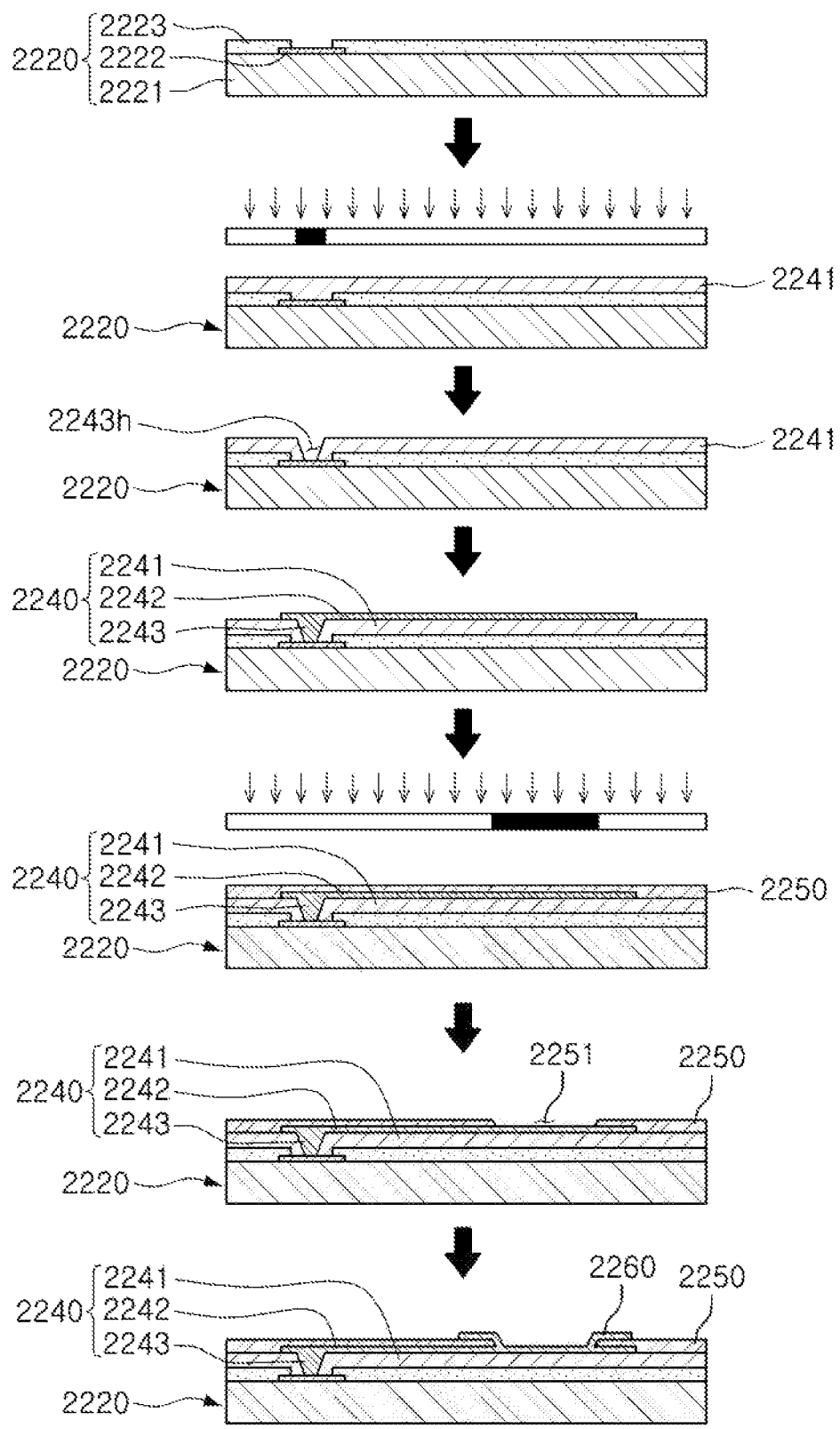
FIG. 4 is a schematic cross-sectional diagram illustrating a process of packaging a fan-in semiconductor package.

FIG. 4 is a schematic cross-sectional diagram illustrating a process of packaging a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
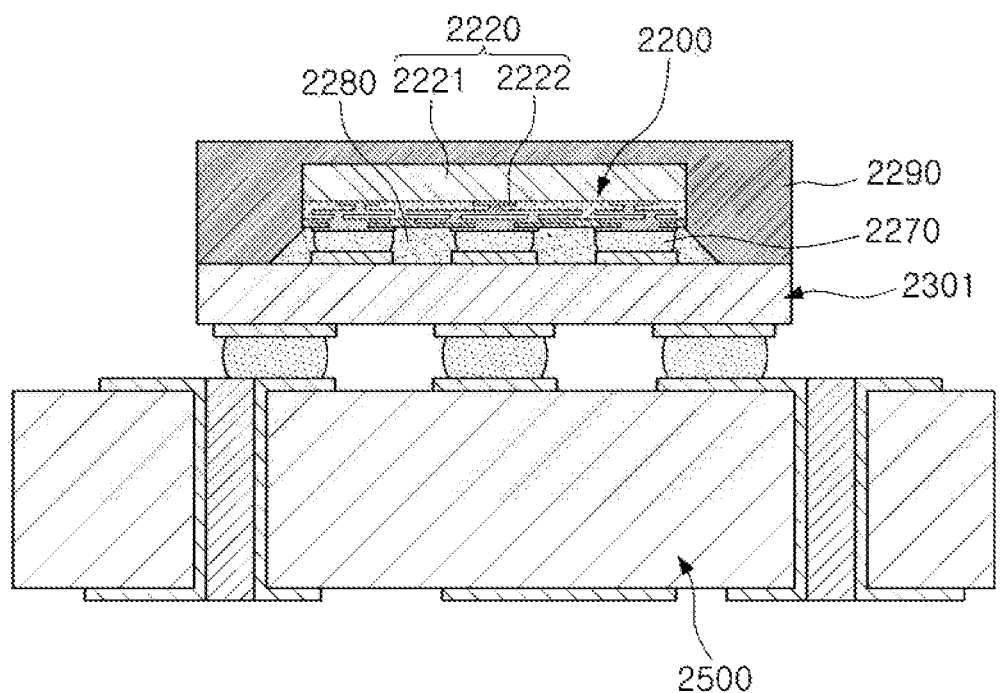
FIG. 5 is a schematic cross-sectional diagram illustrating an example in which a fan-in semiconductor package is mounted on a BGA substrate and mounted on a mainboard of an electronic device.
Figure 6:
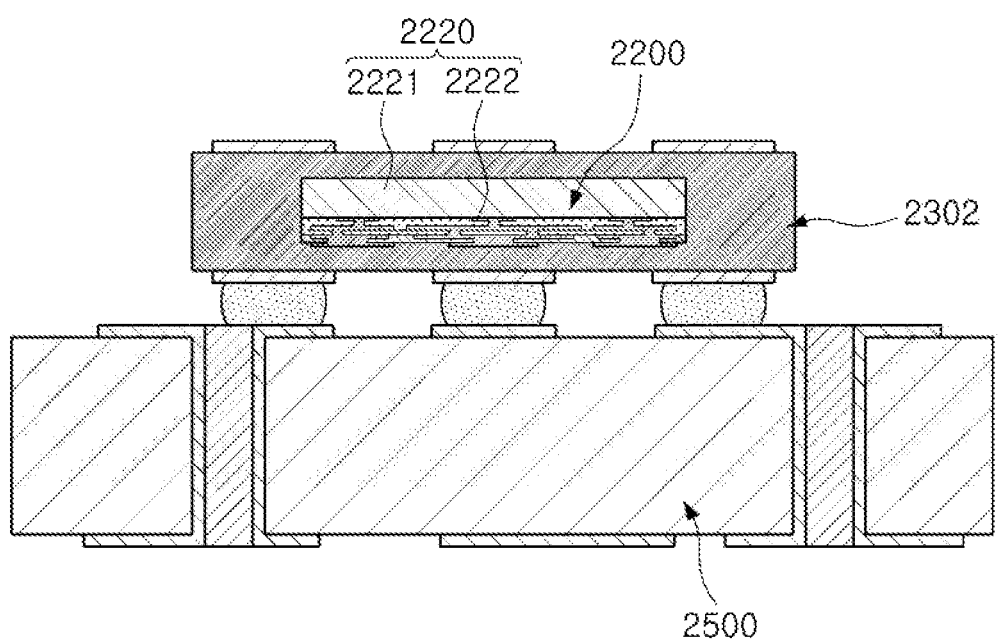
FIG. 6 is a schematic cross-sectional diagram illustrating an example in which a fan-in semiconductor package is embedded in a ball grid array (BGA) substrate and mounted on a mainboard of an electronic device.

FIG. 5 is a schematic cross-sectional diagram illustrating an example in which a fan-in semiconductor package is mounted on a ball grid array (BGA) substrate and mounted on a mainboard of an electronic device;

FIG. 6 is a schematic cross-sectional diagram illustrating an example in which a fan-in semiconductor package is embedded in a ball grid array (BGA) substrate and mounted on a mainboard of an electronic device Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
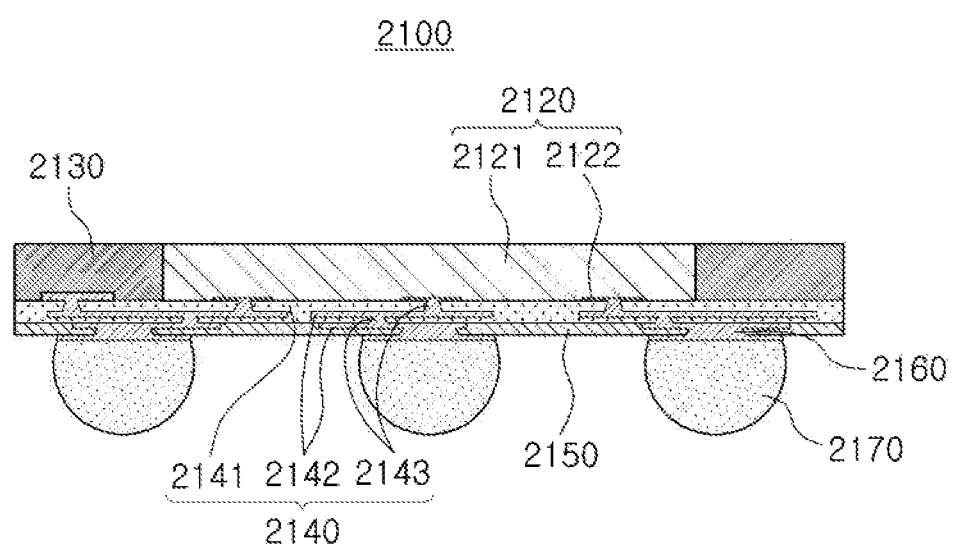
FIG. 7 is a schematic cross-sectional diagram illustrating a fan-out semiconductor package.

FIG. 7 is a schematic cross-sectional diagram illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
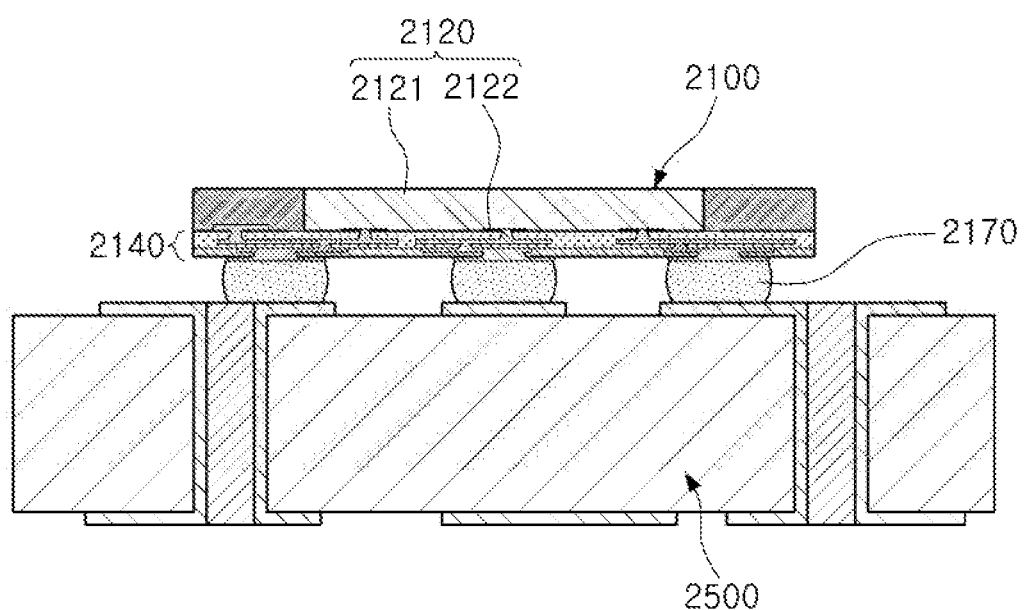
FIG. 8 is a schematic cross-sectional diagram illustrating an example in which a fan-out semiconductor package is mounted on a mainboard of an electronic device.

FIG. 8 is a schematic cross-sectional diagram illustrating an example in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

In the description below, a fan-out semiconductor package in which a semiconductor chip may be disposed using a frame including a recessed portion having a blind form, and accordingly, when a grinding process is used, a residual thickness of an interconnect structure, electrically connecting a wiring of the frame and/or a connection pad of the semiconductor chip to a redistribution layer, may be measured will be described with reference to drawings.

Figure 9:
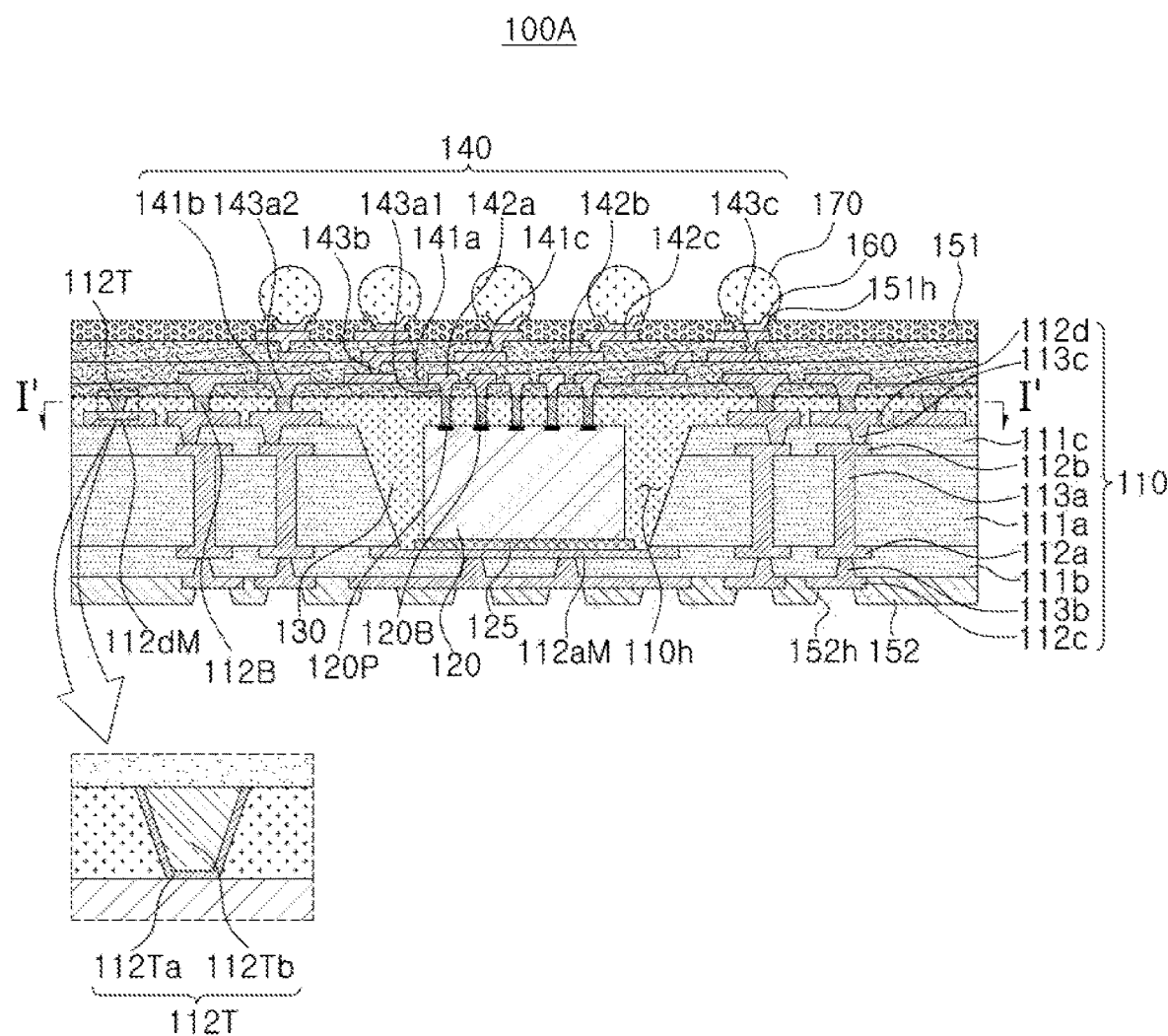
FIG. 9 is a schematic cross-sectional diagram illustrating an example of a fan-out semiconductor package.

FIG. 9 is a schematic cross-sectional diagram illustrating an example of a fan-out semiconductor package.

Figure 10:
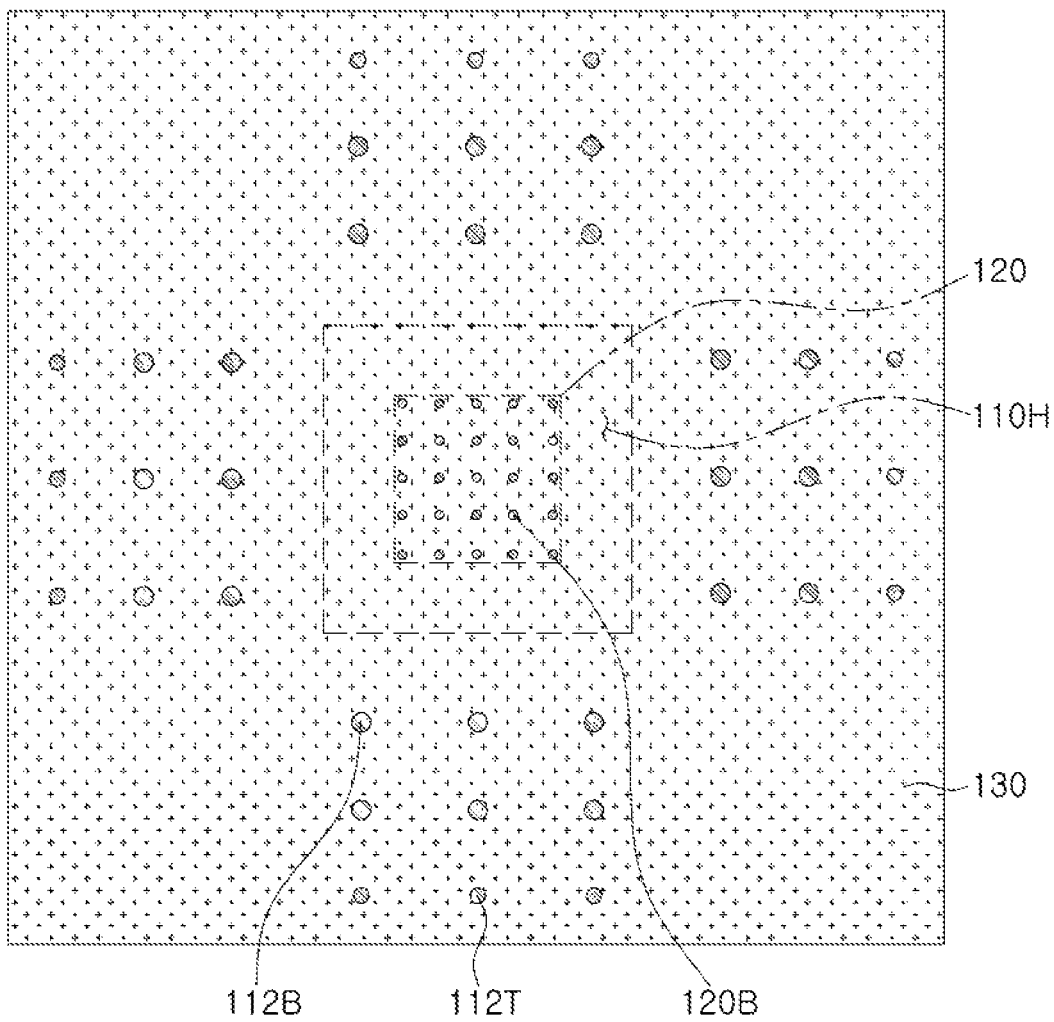
FIG. 10 is a schematic cross-sectional plan diagram illustrating a fan-out semiconductor package in FIG. 9 taken along lines I-I'.

FIG. 10 is a schematic cross-sectional plan diagram illustrating a fan-out semiconductor package in FIG. 9 taken along lines I-I'.

Referring to the diagrams, a fan-out semiconductor package 100A according to an exemplary embodiment may include a frame 110 including a plurality of insulating layers 111a, 111b, and 111c, a plurality of wiring layers 112a, 112b, 112c, and 112d, a plurality of connection via layers 113a, 113b, and 113c, and a dummy layer 112dM disposed on the same level as a level of an outermost wiring layer 112d among the plurality of wiring layers 112a, 112b, 112c, and 112d, and having a recessed portion 110H including a stopper layer 112aM disposed on a bottom surface of the recessed portion 110H, a semiconductor chip 120 having an active surface on which a connection pad 120P is disposed and an inactive surface opposing the active surface, and disposed in the recessed portion 110H such that the inactive surface opposes the stopper layer 112aM, a first interconnect structure 120B disposed on the connection pad 120P, a second interconnect structure 112B disposed on the outermost wiring layer 112d, a dummy structure 112T disposed on the dummy layer 112dM, an encapsulant 130 covering at least portions of the frame 110, the semiconductor chip 120, the first interconnect structure 120B, the second interconnect structure 112B, and the dummy structure 112T, and filling at least a portion of the recessed portion 110H, and a connection member 140 disposed on the frame 110 and the active surface of the semiconductor chip 120, and comprising redistribution layers 142a, 142b, and 142c electrically connected to first and second metal bumps and the first and second interconnect structures 120B and 112B. The dummy structure 112T may have sloped side surfaces with respect to an upper surface of the dummy layer 112dM.

Meanwhile, to use the frame having a recessed portion having a blind form, to dispose a semiconductor chip in the recessed portion and encapsulate the semiconductor chip, and to form a connection member on the semiconductor chip, it may be necessary to form metal posts, and the like, on a connection pad of the semiconductor chip in advance. In this case, to make a planar surface for forming a connection member including a redistribution layer, a grinding process may be necessary. A grinding process may be necessary to expose the metal posts and to configure differences in heights of the metal posts to be constant. However, when a grinding process is undertaken, it may be necessary to measure a residual thickness of the metal post, and a relatively high-priced measuring device should be used to measure the residual thickness. Also, even when a high-priced measuring device is used, if the measuring device is not properly set, defects may occur due to over-grinding.

The fan-out semiconductor package 100A according to the exemplary embodiment may include the interconnect structures 120B and 112B such as metal posts, and may also include the dummy structure 112T having sloped side surfaces such that a thickness of the dummy structure 112T decreases downwardly during a grinding process. As the dummy structure 112T has a tapered shape as described above, dimensions thereof in plan view may continuously change depending on a residual thickness of the dummy structure 112T during a grinding process. For example, the dummy structure 112T may have an inverted trapezium shape in a cross sectional view, and accordingly, the more the dummy structure 112T is grinded during a grinding process, the smaller the dimension of the grinded surface (i.e., the exposed surface being grinded) of the residual dummy structure 112T in plan view. Thus, if a dimension depending on a thickness of the dummy structure 112T is secured in advance as a reference, a residual thickness of the interconnect structures 120B and 112B positioned on similar levels may be measured without using an expensive measuring device or complex settings.

In the description below, elements included in the fan-out semiconductor package 100A will be described in greater detail.

The frame 110 may improve stiffness of the fan-out semiconductor package 100A depending on a specific material of the frame 110, and may secure consistency in thickness of the encapsulant 130, and the like. Also, as the frame 110 includes the wiring layers 112a, 112b, 112c, and 112d and the connection via layers 113a, 113b, and 113c, the frame 110 may serve as upper and lower electrical connection members. Further, as the frame 110 includes the third wiring layer 112c disposed in a position lower than the inactive surface of the semiconductor chip 120, a backside wiring layer for the semiconductor chip 120 may be provided without a separate process for forming a backside wiring layer. In other words, one of the wiring layers 112a, 112b, 112c, and 112d may be disposed in a position lower than the stopper layer 112aM.

The frame 110 may have the recessed portion 110H having a blind form, which may be formed by using the stopper layer 112aM as a stopper. The semiconductor chip 120 may be attached to the stopper layer 112aM such that the inactive surface of the semiconductor chip 120 is attached to the stopper layer 112aM by means of an well-known attachment member 125 such as a die attach film (DAF). The recessed portion 110H may be formed by a sand blast process, which will be described later, and in this case, a cross-section of the recessed portion 110H may have a tapered shape. In other words, a wall of the recessed portion 110H may have a specific slope with reference to the stopper layer 112aM. In this case, a process of aligning the semiconductor chips 120 may be further simplified, which may increase a yield.

The frame 110 may include a core insulating layer 111a, a first wiring layer 112a and a second wiring layer 112b respectively disposed on a lower surface and an upper surface of the core insulating layer 111a, a first built-up insulating layer 111b disposed in a lower portion of the core insulating layer 111a and covering the first wiring layer 112a, a third wiring layer 112c disposed on the first built-up insulating layer 111b, a second built-up insulating layer 111c disposed in an upper portion of the core insulating layer 111a and covering the second wiring layer 112b, and a fourth wiring layer 112d and the dummy layer 112dM disposed on the second built-up insulating layer 111c. The frame 110 may further include a first connection via layer 113a penetrating through the core insulating layer 111a and electrically connecting the first and second wiring layers 112a and 112b to each other, a second connection via layer 113b penetrating through the first built-up insulating layer 111b and electrically connecting the first and third wiring layers 112a and 112c to each other, and a third connection via layer 113c penetrating through the second built-up insulating layer 111c and electrically connecting the second and fourth wiring layers 112b and 112d to each other.

The first to fourth wiring layers 112a, 112b, 112c, and 112d in the frame 110 may be electrically connected to one another, and may be electrically connected to the connection pads 120P, respectively. The recessed portion 110H may penetrate through the core insulating layer 111a and the second built-up insulating layer 111c, but may not penetrate through the first built-up insulating layer 111b. The stopper layer 112aM may be disposed on a lower surface of the core insulating layer 111a and may be covered by the first built-up insulating layer 111b. The first built-up insulating layer 111b, the second built-up insulating layer 111c, the wiring layers 112c and 112d and the connection via layers 113b and 113c disposed on the first built-up insulating layer 111b and the second built-up insulating layer 111c may have a greater number of layers than the number of layers illustrated in the diagrams, and may have symmetrical forms with reference to the core insulating layer 111a.

The stopper layer 112aM may be a metal layer including a metal such as copper (Cu), and the like. Alternatively, the stopper layer 112aM may include a material having a lower etch rate in a sand blast process than an etch rate of a metal. For example, a dry film photoresist may be used as the stopper layer 112aM. When the stopper layer 112aM is a metal layer, the stopper layer 112aM may be used as a ground, and in this case, the stopper layer 112aM may be electrically connected to a ground of at least one of the wiring layers 112a, 112b, 112c, and 112d. A lower surface of the stopper layer 112aM may be covered by the first built-up insulating layer 111b, and at least a portion of an upper surface may be exposed by the recessed portion 110H. The stopper layer 112aM may be configured such that a thickness of a region exposed from the core insulating layer 111a by the recessed portion 110H may be lower than a thickness of an edge region which is not exposed from the core insulating layer 111a by the recessed portion 110H. That is because the exposed portion may be partially removed during a sand blast process.

As materials of the insulating layers 111a, 111b, and 111c, an insulating material may be used. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like, for example. When a material having high stiffness such as prepreg including glass fiber, and the like, is used, the frame 110 may be used as a support member for controlling warpage of the package 100A.

The core insulating layer 111a may have a thickness greater than thicknesses of the first built-up insulating layer 111b and the second built-up insulating layer 111c. The core insulating layer 111a may have a relatively great thickness to maintain stiffness, and the first built-up insulating layer 111b and the second built-up insulating layer 111c may be employed to form a greater number of the wiring layers 112c and 112d. The core insulating layer 111a may include an insulating material different from the materials of the first built-up insulating layer 111b and the second built-up insulating layer 111c. For example, the core insulating layer 111a may be employed using a copper clad laminate (CCL) film having a relatively great thickness, and the first built-up insulating layer 111b and the second built-up insulating layer 111c may be employed using prepreg or ABF having a relatively low thickness, but exemplary embodiments thereof are not limited thereto. Similarly, the first connection via layer 113a penetrating through the core insulating layer 111a may have a diameter greater than diameters of the second and third connection via layers 113b and 113c penetrating through the first and second built-up insulating layers 111b and 111c.

The wiring layers 112a, 112b, 112c, and 112d may redistribute the connection pad 120P of the semiconductor chip 120 along with the redistribution layers 142a, 142b, and 142c. Materials of the wiring layers 112a, 112b, 112c, and 112d may be a metal material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform a variety of functions depending on designs of the respective layers. For example, the wiring layers 112a, 112b, 112c, and 112d may include a ground (GND) pattern, a power (PWR) pattern, a signal (S) pattern, and the like. The signal (S) pattern may include various signal other than a ground (GND) pattern, a power (PWR) pattern, and the like, such as a data signal, for example. The wiring layers 112a, 112b, 112c, and 112d may also include various pad patterns.

The wiring layers 112a, 112b, 112c, and 112d may have thicknesses greater than thicknesses of the redistribution layers 142a, 142b, and 142c of the connection member 140. The frame 110 may have a thickness greater than a thickness of the semiconductor chip 120, and thus, the wiring layers 112a, 112b, 112c, and 112d may have greater sizes. The redistribution layers 142a, 142b, and 142c of the connection member 140 may have relatively smaller sizes to reduce thicknesses of the redistribution layers 142a, 142b, and 142c.

The dummy layer 112dM may be disposed in an uppermost portion of the frame 110 to employ the dummy structure 112T. The dummy layer 112dM may be formed simultaneously with an uppermost wiring layer 112d of the frame 110, and may have the same thickness. A material of the dummy layer 112dM may be a metal material such as copper (Cu), aluminum (Al), silver (Ag), tin (Sn), gold (Au), nickel (Ni), lead (Pb), titanium (Ti), or alloys thereof. In other words, the dummy layer 112dM may be a metal layer, that is, a metal layer having a pad pattern form. If desired, the dummy layer 112dM may work as a ground. In this case, the dummy layer 112dM and the dummy structure 112T may be electrically connected to at least one of grounds on the wiring layers 112a, 112b, 112c, and 112d of the frame 110.

The connection via layers 113a, 113b, and 113c may electrically connect the wiring layers 112a, 112b, 112c, and 112d formed in different layers, and may accordingly form an electrical path in the frame 110. As materials of the connection via layers 113a, 113b, and 113c, a metal material may be used. The connection via layers 113a, 113b, and 113c may be charged with a metal material, or a metal material may be formed along a wall of a via hole. The first connection via layer 113a may have a cross-section having a cylindrical shape or hourglass shape. In this case, the second and third connection via layers 113b and 113c may have cross-sections having tapered shapes, tapered in opposite directions, with reference to the core insulating layer 111a.

At least one of the second connection via layers 113b may be connected to the stopper layer 112aM, and may be connected to a power having a plate form and/or a ground pattern on the third wiring layer 112c. In other words, at least one of the second connection via layers 113b may connect the stopper layer 112aM to a power having a plate form and/or a ground pattern on the third wiring layer 112c. In this case, the stopper layer 112aM may be a metal layer, and may function as a power and/or a ground pattern. Accordingly, heat radiated through the inactive surface of the semiconductor chip 120 may be emitted to a power portion of the package 100A.

The semiconductor chip 120 may be an integrated circuit (IC) in which several hundreds to several millions of devices are integrated in one chip. The semiconductor chip 120 may be, for example, a processor chip such as a central processor (e.g., CPU), a graphics processor (e.g., GPU), a field programmable gate array (FPGA), a digital signal processor, a cryptographic processor, a microprocessor, a micro controller, or the like, specifically an application processor (AP), for example, but an example of the semiconductor chip 120 is not limited thereto. The semiconductor chip 120 may be a memory such as other types of volatile memory (e.g., DRAM), a non-volatile memory (e.g. ROM), a flash memory, or the like, or may be an analog-digital converter or a logic such as an application-specific IC (ASIC).

The semiconductor chip 120 may be formed based on an active wafer. A base material of a body may be silicon (Si), germanium (Ge), gallium arsenide (GaAs), or the like. Various circuits may be formed on the body. The connection pad 120P disposed on the active surface of the body may electrically connect the semiconductor chip 120 to other components, and may be formed of a metal material such as aluminum (Al), copper (Cu), and the like, without being limited thereto. A passivation film (not illustrated) exposing the connection pad 120P, such as an oxide layer, a nitride layer, or the like, may be formed on the body, and the passivation film (not illustrated) may be a double layer formed of an oxide layer and a nitride layer. The passivation film (not illustrated) may have an opening (not illustrated) exposing at least a portion of the connection pad 120P. An insulation film (not illustrated) may be further disposed in other positions if desired. The semiconductor chip 120 may be a bare die, or may be a packaged die on which an insulating layer (not illustrated), a redistribution layer (not illustrated), and a bump (not illustrated), and the like, are formed on the active surface of the semiconductor chip 120.

The first interconnect structure 120B may be employed to electrically connect the connection pad 120P of the semiconductor chip 120 to the redistribution layers 142a, 142b, and 142c of the connection member 140. The first interconnect structure 120B may be a metal post or a metal pillar, such as a copper post or a copper pillar, but an example of the first interconnect structure 120B is not limited thereto. The first interconnect structure 120B may have approximately vertical side surfaces. In this case, an exposed upper surface of the first interconnect structure 120B being grinded in a grinding process may maintain substantially the same area. The number of the first interconnect structures 120B may not be limited to any particular number, but may vary depending on the number of the connection pads 120P. The first interconnect structure 120B may be connected to the first redistribution layer 142a through one first connection via 143a1 of the connection member 140.

The second interconnect structure 112B may be employed to electrically connect the uppermost wiring layer 112d of the frame 110 to the redistribution layers 142a, 142b, and 142c of the connection member 140. The second interconnect structure 112B may also be a metal post, such as a copper post, but an example of the second interconnect structure 112B is not limited thereto. The second interconnect structure 112B may also have approximately vertical side surfaces. In this case, an exposed upper surface of the second interconnect structure 112B being grinded in a grinding process may maintain substantially the same area. The number of the second interconnect structures 112B may not be limited to any particular number, but may vary depending on a design of a pattern on the uppermost wiring layer 112d. The second interconnect structure 112B may be connected to the first redistribution layer 142a through the other first connection via 143a2 of the connection member 140.

The dummy structure 112T may be disposed on the dummy layer 112dM disposed in an uppermost portion of the frame 110. The dummy layer 112dM and the dummy structure 112T may be disposed in an outermost portion of the frame 110, and may accordingly affect a design of the frame 110 at a minimum. The dummy structure 112T may be electrically insulated at least from the first and second interconnect structures 120B and 112B. The dummy structure 112T may include a metal material such as copper (Cu), aluminum (Al), silver (Ag), tin (Sn), gold (Au), nickel (Ni), lead (Pb), titanium (Ti), or alloys thereof, and the like. The dummy structure 112T may have sloped side surfaces. It may be preferable to configure a width of an upper surface of the dummy structure 112T to be greater than a width of a lower surface in terms of formation of the dummy structure 112T or measurement of a residual thickness during a grinding process. For example, the dummy structure 112T may have a cross-section having a reversed trapezoidal shape. The upper surface of the dummy structure 112T may be in contact with an insulating material of the connection member 140. For example, the upper surface of the dummy structure 112T may be covered by the first insulating layer 141a.

The dummy structure 112T may include a seed layer 112Ta being in contact with a surface of the dummy layer 112dM and the encapsulant 130 and disposed on side surfaces of the dummy structure 112T, and a conductive layer 112Tb disposed on the seed layer 112Ta and filling an internal space formed by the seed layer 112Ta. For example, the dummy structure 112T may be formed by forming a deep via hole exposing a surface of the dummy layer 112dM in the encapsulant 130, forming the seed layer 112Ta on a surface of the dummy layer 112dM and on a wall of the deep via hole using a stopper, forming the conductive layer 112Tb by filling the deep via hole through a plating process. The seed layer 112Ta may be a single layer formed of a copper (Cu) layer, or may be a double layer formed of a titanium (Ti) layer and a copper (Cu) layer, but an example of the seed layer 112Ta is not limited thereto. The conductive layer 112Tb may be a single layer formed of a copper (Cu) layer, but an example of the conductive layer 112Tb is not limited thereto.

The encapsulant 130 may cover at least portions of the frame 110, the semiconductor chip 120, the first and second interconnect structures 120B and 112B, and the dummy structure 112T, and may fill at least a portion of the recessed portion 110H. A material of the encapsulant 130 may not be limited to any particular material. For example, a material of the encapsulant 130 may be an insulating material, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like. If desired, a photoimageable encapsulant (PIE) resin may also be used.

The encapsulant 130 may fill spaces between the first interconnect structure 120B, the second interconnect structure 112B, and the dummy structure 112T such that upper surfaces of the first and second interconnect structures 120B and 112B and the dummy structure 112T expose from an upper surface of the encapsulant 130. In this case, the upper surfaces of the first and second interconnect structures 120B and 112B and the dummy structure 112T may be coplanar with the upper surface of the encapsulant 130. That is because the upper surfaces of the first and second interconnect structures 120B and 112B and the dummy structure 112T may be simultaneously grinded with the encapsulant 130. Accordingly, the second interconnect structure 112B may have the same thickness as a thickness of the dummy structure 112T.

The connection member 140 may redistribute the connection pad 120P of the semiconductor chip 120, and may electrically connect the wiring layers 112a, 112b, 112c, and 112d of the frame 110 to the connection pad 120P of the semiconductor chip 120. Several to several hundreds of connection pads 120P having a variety of functions may be redistributed through the connection member 140, and may be physically and/or electrically connected to an external entity through the electrical interconnect structure 170 in accordance with the respective functions.

The connection member 140 include the first insulating layer 141a disposed on the frame 110, the encapsulant 130, and the active surface of the semiconductor chip 120, the first redistribution layer 142a disposed on the first insulating layer 141a, the first connection vias 143a1 and 143a2 penetrating through the first insulating layer 141a and electrically connecting the first redistribution layer 142a to the interconnect structures 120B and 112B, the second insulating layer 141b disposed on the first insulating layer 141a and covering the first redistribution layer 142a, the second redistribution layer 142b disposed on the second insulating layer 141b, the second connection via 143b penetrating through the second insulating layer 141b and electrically connecting the first and second redistribution layers 142a and 142b to each other, the third insulating layer 141c disposed on the second insulating layer 141b and covering the second redistribution layer 142b, the third redistribution layer 142c disposed on the third insulating layer 141c, and the third connection via 143c penetrating through the third insulating layer 141c and electrically connecting the second and third redistribution layers 142b and 142c to each other. The insulating layers, the redistribution layers, and the via layers may be formed of greater number of layers or lower number of layers than the number of layers described in the exemplary embodiment.

A material of the insulating layers 141a, 141b, and 141c may be an insulating material, and the insulating material may be a photosensitive insulating material such as a PID resin other than the insulating materials described above. In other words, the insulating layers 141a, 141b, and 141c may be photosensitive insulating layers. When the insulating layers 141a, 141b, and 141c are photosensitive, the insulating layers 141a, 141b, and 141c may have significantly reduced thicknesses, and may easily implement a fine pitch of the connection vias 143a1, 143a2, 143b, and 143c. The insulating layers 141a, 141b, and 141c may be photosensitive insulating layers including an insulating resin and an inorganic filler. When the insulating layers 141a, 141b, and 141c have multiple layers, the materials of the insulating layers 141a, 141b, and 141c may be the same, or may be different if desired. When the insulating layers 141a, 141b, and 141c have multiple layers, the insulating layers 141a, 141b, and 141c may be integrated with one another through a process such that boundaries among the insulating layers 141a, 141b, and 141c may not be distinct.

The redistribution layers 142a, 142b, and 142c may substantially redistribute the connection pad 120P, and a material of the redistribution layers 142a, 142b, and 142c may be a metal material such as copper (Cu), aluminum (Al), silver (Ag), tin (Sn), gold (Au), nickel (Ni), lead (Pb), titanium (Ti), or alloys thereof, and the like. The redistribution layers 142a, 142b, and 142c may perform a variety of functions depending on a design of the respective layers. For example, the redistribution layers 142a, 142b, and 142c may include a ground (GND) pattern, a power (PWR) pattern, a signal (S) pattern, and the like, The signal (S) pattern may include various signals other than the ground (GND) patterns, the power (PWR) patterns, and the like, such as data signals, and the like. The redistribution layers 142a, 142b, and 142c may also include various pad patterns.

The connection vias 143a1, 143a2, 143b, and 143c may electrically connect the redistribution layers 142a, 142b, and 142c, the interconnect structures 120B and 112B, and the like, formed in different layers, to one another, and may accordingly form an electrical path in the package 100A. The connection vias 143a1, 143a2, 143b, and 143c may function as a via for a signal, a via for a ground, a via for a power, and the like. A material of the connection vias 143a1, 143a2, 143b, and 143c may be a metal material such as copper (Cu), aluminum (Al), silver (Ag), tin (Sn), gold (Au), nickel (Ni), lead (Pb), titanium (Ti), or alloys thereof, and the like. The connection vias 143a1, 143a2, 143b, and 143c may be a filled type filled with a metal material, or may be a conformal type in which a metal material is formed along a wall of a via hole. The connection vias 143a1, 143a2, 143b, and 143c may have cross-sections having tapered shapes, or the like. The one first connection via 143a1 may have the same height as a height of the other first connection via 143a2.

A first passivation layer 151 may be an additional element, and may protect the connection member 140 from external physical and chemical damages, and the like. The first passivation layer 151 may have an opening 151h exposing at least a portion of the uppermost redistribution layer 142c of the connection member 140. In the first passivation layer 151, several to several hundreds of the openings 151h may be formed. A material of the first passivation layer 151 may not be limited to any particular material. For example, the material may be an insulating material, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like, or may be a solder resist.

The second passivation layer 152 may be an additional element, and may protect the frame 110 from external physical and chemical damages, and the like. The second passivation layer 152 may have an opening 152h exposing at least a portion of the lowermost wiring layer 112c of the frame 110. In the second passivation layer 152, several to several hundreds of the openings 152h may be formed. A material of the second passivation layer 152 may not be limited to any particular material. For example, the material may be an insulating material, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like, or may be a solder resist.

An under bump metal layer 160 may be an additional element, and may improve connection reliability of an electrical interconnect structure 170, thereby improving board level reliability of the package 100A. The under bump metal layer 160 may be connected to the uppermost redistribution layer 142c of the connection member 140 exposed through the opening 151h of the first passivation layer 151. The under bump metal layer 160 may be formed by a metallization method using a well-known metal material, a metal, but an example of the method is not limited thereto.

The electrical interconnect structure 170 may be an additional element, and may physically and/or electrically connect the fan-out semiconductor package 100A to an external entity. For example, the fan-out semiconductor package 100A may be mounted on a mainboard of an electronic device through the electrical interconnect structure 170. The electrical interconnect structure 170 may be formed of a metal having a low melting point, a material including tin (Sn), for example, such as a solder, but a material of the electrical interconnect structure 170 is not limited thereto. The electrical interconnect structure 170 may be a land, a ball, a pin, and the like. The electrical interconnect structure 170 may be formed of multiple layers or a single layer. When the electrical interconnect structure 170 is formed of multiple layers, the electrical interconnect structure 170 may include a copper (Cu) pillar or a solder, and when the electrical interconnect structure 170 is formed of a single layer, the electrical interconnect structure 170 may include a tin-silver solder or copper (Cu). However, an example of the electrical interconnect structure 170 may not be limited thereto.

The number, a size of a gap, an arrangement form, and the like, of the electrical interconnect structure 170 may not be limited to any particular example, and may vary depending on a design. For example, the number of the electrical interconnect structures 170 may be provided as several tens or several thousands of the electrical interconnect structures 170 depending on the number of the connection pads 120P, or may be higher or lower than several tens or several thousands. When the electrical interconnect structures 170 is a solder ball, the electrical interconnect structures 170 may cover a side surface extending onto one surface of the first passivation layer 151, and connection reliability may accordingly improve.

At least one of the electrical interconnect structures 170 may be disposed in a fan-out region. The fan-out region may be a region beyond a region in which the semiconductor chip 120 is disposed. The fan-out package may have improved reliability as compared to a fan-in package, may implement a plurality of I/O terminals, and a 3D interconnection may be easily implemented. Also, the fan-out package may have a significantly reduced thickness, and may be cost-competitive, as compared to a ball grid array (BGA) package, a land grid array (LGA) package, and the like.

Although not illustrated, if desired, a metal thin film may be formed on a wall of the recessed portion 110H in order to radiate heat and/or to shield electromagnetic waves. Also, if desired, a plurality of the semiconductor chips 120 performing the same function or different functions may be disposed in the recessed portion 110H. Further, if desired, a separate passive component, such as an inductor, a capacitor, or the like, may be disposed in the recessed portion 110H. Also, if desired, a surface mount technology (SMT) component including a passive component such as an inductor, a capacitor, or the like, may be disposed on surfaces of the first and second passivation layers 151 and 152, for example.

FIGS. 11 to 17 are diagrams illustrating processes of manufacturing a fan-out semiconductor package illustrated in FIG. 9.

Figure 11:
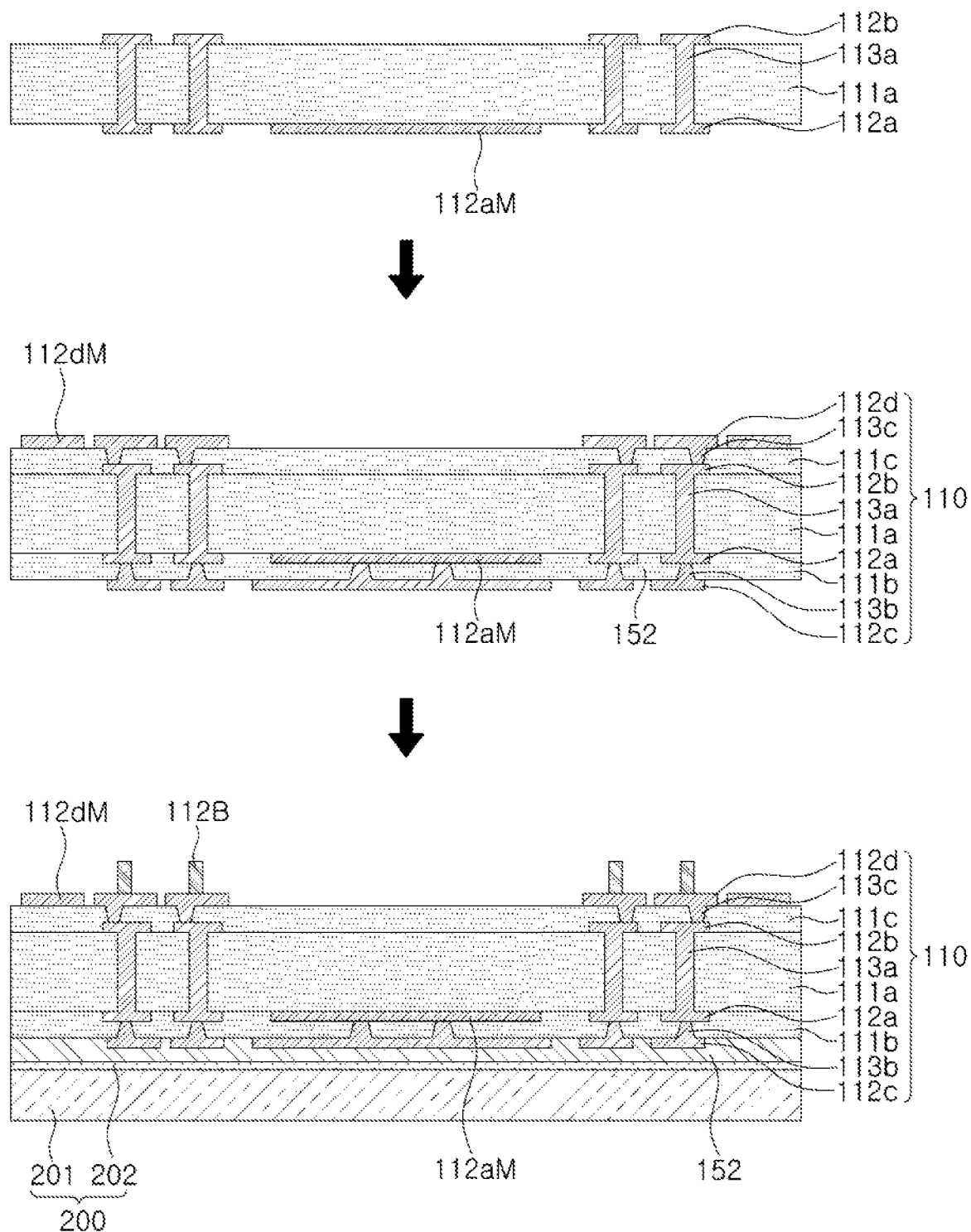
FIGS. 11 to 17 are diagrams illustrating processes of manufacturing a fan-out semiconductor package in FIG. 9.

Referring to FIG. 11, a core including layer 111a may be prepared using a copper clad laminate (CCL), and the like, and first and second wiring layers 112a and 112b, a stopper layer 112aM, and a first connection via layer 113a may be formed on the core including layer 111a using a well-known plating process. A via hole for the first connection via layer 113a may be formed using a mechanical drill and/or a laser drill, or the like. First and second built-up insulating layers 111b and 111c may be formed on both surfaces of the core including layer 111a. The first and second built-up insulating layers 111b and 111c may be formed by laminating prepreg or ABF and performing a curing process. Third and fourth wiring layers 112c and 112d, a dummy layer 112dM, and second and third connection via layers 113b and 113c may be formed using a well-known plating process in each of the first and second built-up insulating layers 111b and 111c. The via holes for the second and third connection via layers 113b and 113c may also be formed using a mechanical drill and/or a laser drill, or the like. A second interconnect structure 112B such as a copper post or a copper pillar may be formed on the uppermost wiring layer 112d of a frame 110 prepared through a series of processes. Meanwhile, depending on processes, the second interconnect structure 112B may be formed after forming a recessed portion 110H. Also, a second passivation layer 152 may be attached to a lower portion of the frame 110, and a carrier film 200 including an insulating layer 201 and a metal layer 202 may be attached onto the second passivation layer 152.

Figure 12:
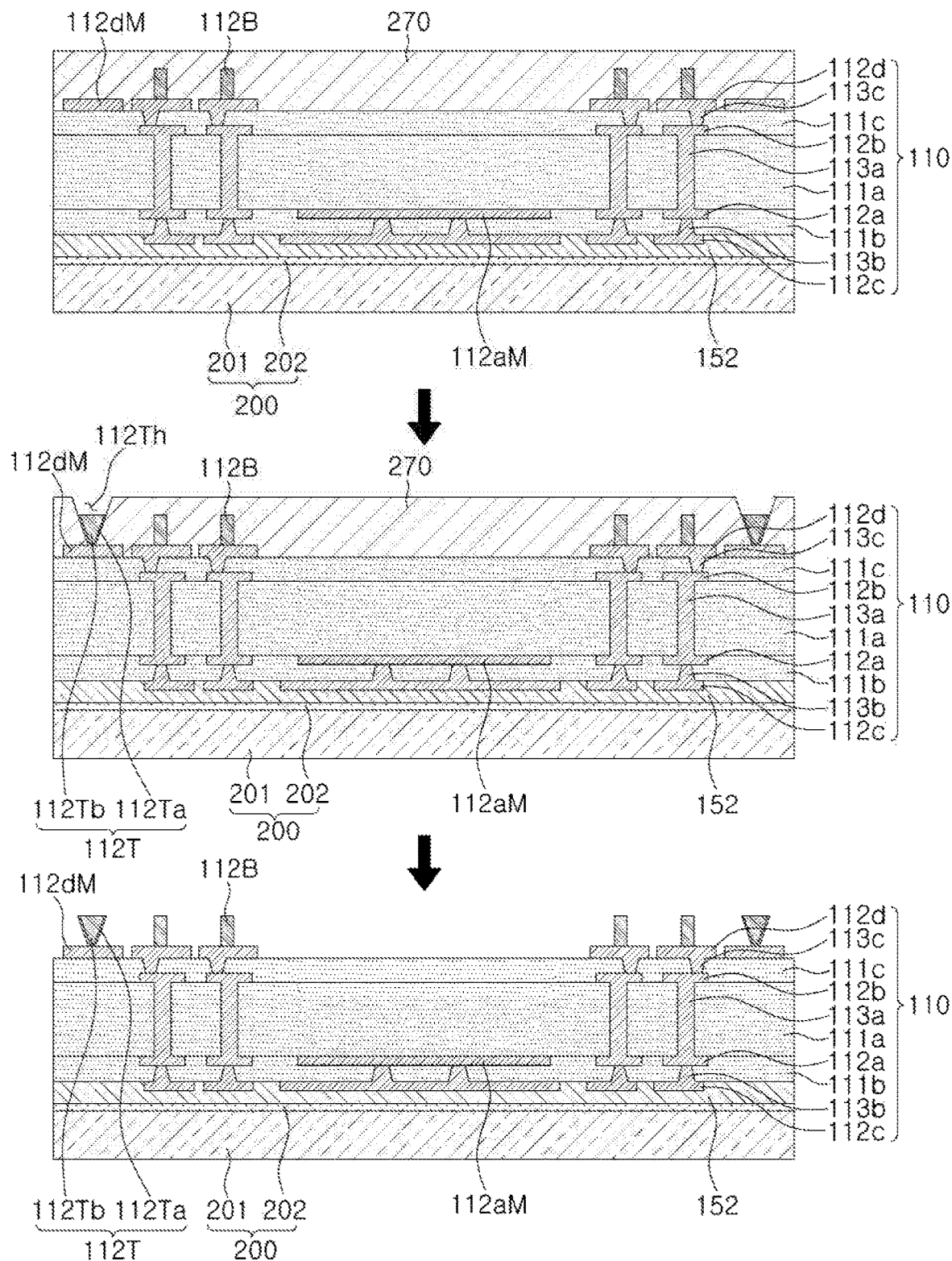

Referring to FIG. 12, a photoresist film 270 may be layered on a frame 110. A deep via hole 112Th exposing at least a portion of a surface of a dummy layer 112dM may be formed on the photoresist film 270 by exposure and development, and a dummy structure 112T filling at least a portion of the deep via hole 112Th may be formed through a plating process. The dummy structure 112T may be formed by forming a seed layer 112Ta on a surface of the dummy layer 112dM and a wall of the deep via hole 112Th using a stopper and forming a conductive layer 112Tb by filling the deep via hole 112Th through a plating process. The dummy structure 112T may have a height similar to a height of the second interconnect structure 112B preferably. The unnecessary seed layer 112Ta, and the like, may be removed by an etching process, and the photoresist film 270 may be exfoliated.

Figure 13:
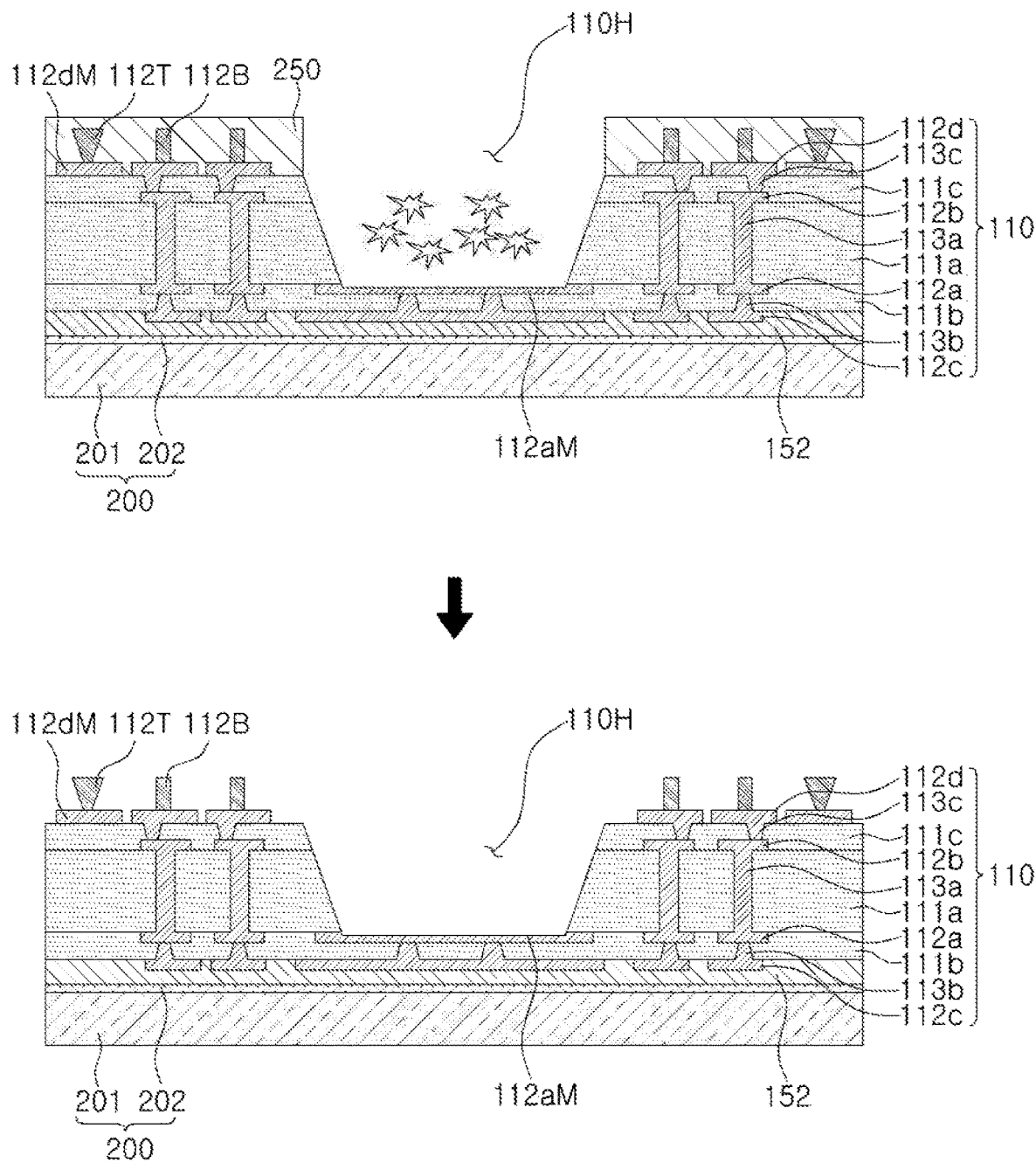

Referring to FIG. 13, a dry film 250 such as a DFR may be attached onto an upper portion of a frame 110. A recessed portion 110H penetrating through a core including layer 111a and a second built-up insulating layer 111c may be formed using a sand blast process, and the like. A stopper layer 112aM may function as a stopper. The recessed portion 110H may have a cross-section having a tapered shape by a sand blast process. The dry film 250 may be removed after forming the recessed portion 110H. Meanwhile, depending on processes, a dummy structure 112T and a second interconnect structure 112B may be formed after forming the recessed portion 110H.

Figure 14:
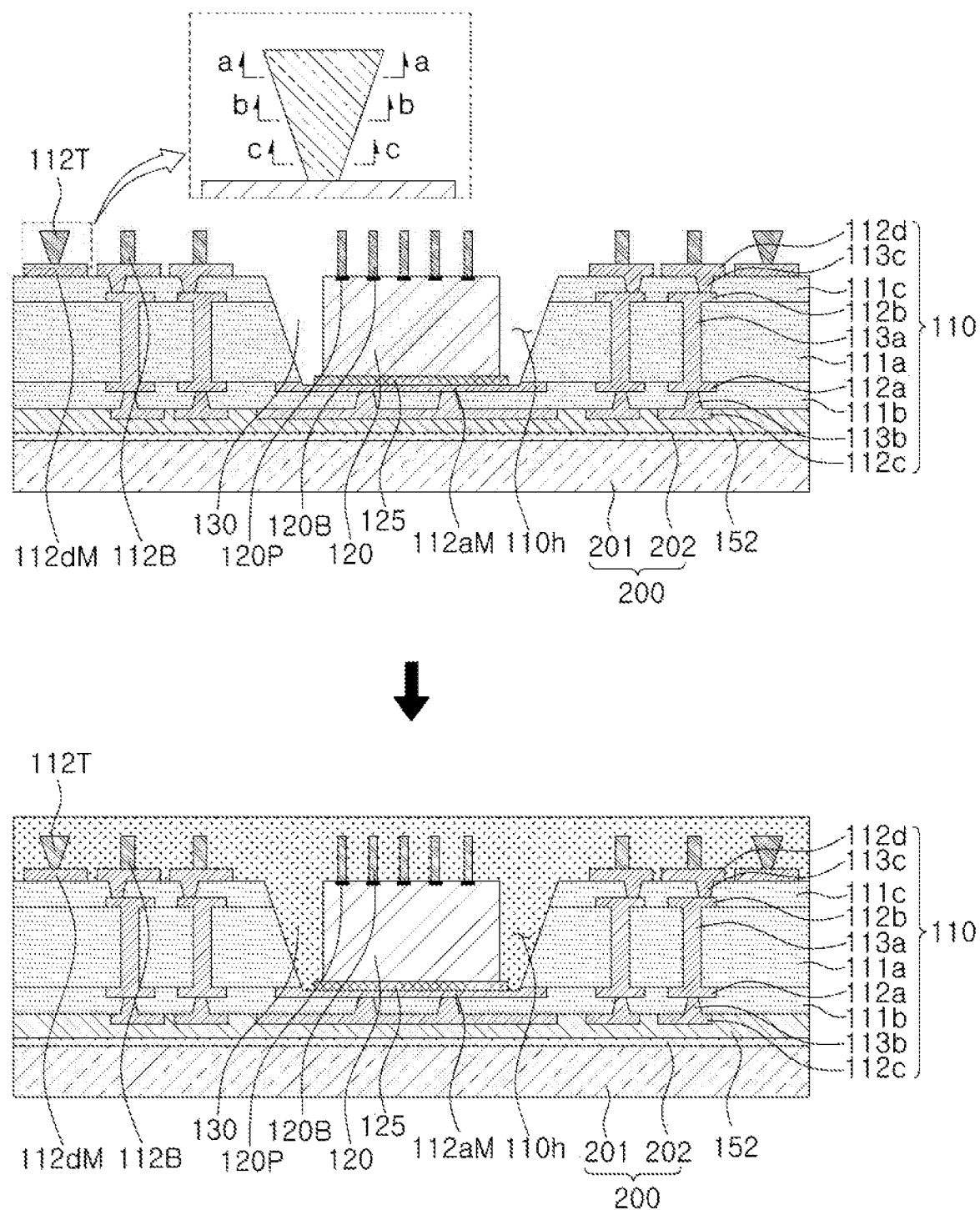

Referring to FIG. 14, an inactive surface may be attached to a stopper layer 112aM, and a semiconductor chip 120 may be disposed in a recessed portion 110H. To attach the inactive surface, a well-known attachment member 125 such as a die attach film (DAF) may be used. The semiconductor chip 120 may be attached in a state in which a first interconnect structure 120B such as a copper post or a copper pillar is formed on a connection pad 120P. Alternatively, the first interconnect structure 120B such as a copper post or a copper pillar may be formed on the connection pad 120P after attaching the semiconductor chip 120. At least portions of a frame 110, the semiconductor chip 120, the first and second interconnect structures 120B and 112B, and a dummy structure 112T may be covered using an encapsulant 130, and at least a portion of the recessed portion 110H may be filled using the encapsulant 130. The encapsulant 130 may be formed by laminating ABF and performing a curing process.

Figure 15:
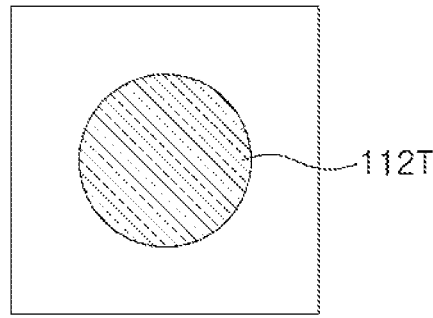
Figure 15:
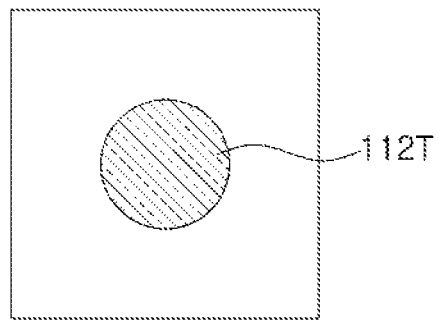
Figure 15:
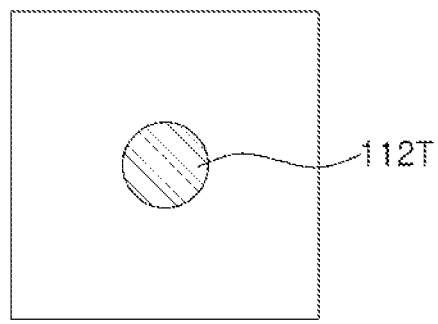

Referring to FIG. 15, as a dummy structure 112T has a tapered shape, as illustrated in the diagram, a dimension of the dummy structure 112T may change depending on positions of thicknesses a, b, and c illustrated in FIG. 14. For example, the dummy structure 112T may have an inverted trapezium shape in a cross sectional view, and the lower the thickness, the smaller the dimension. Thus, when a dimension is secured in accordance with a thickness of the dummy structure 112T in advance as a reference, residual thicknesses of interconnect structures 120B and 112B positioned on similar levels may be measured without a high-priced measuring device or complex settings.

Figure 16:
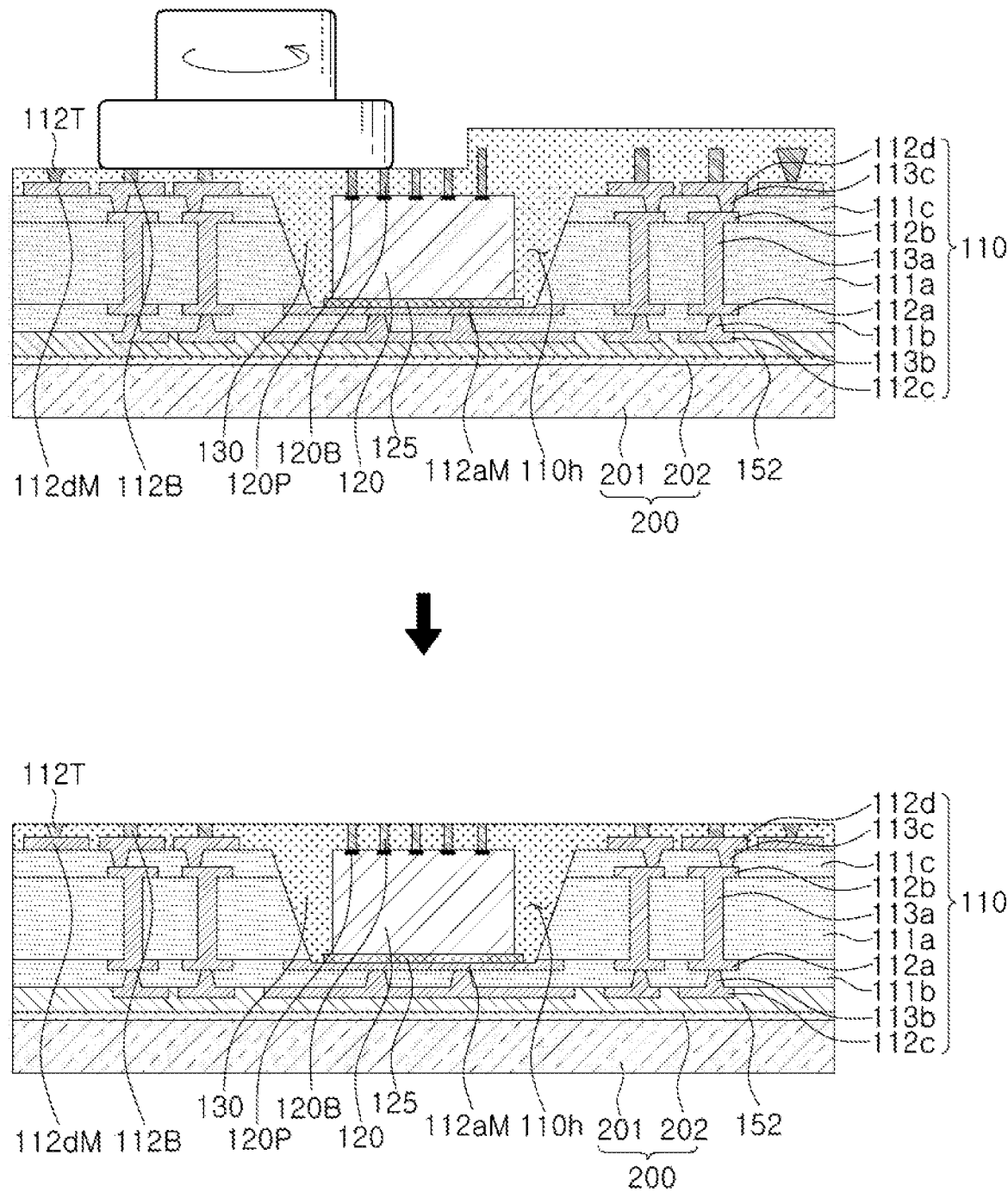

Referring to FIG. 16, a grinding process may be performed to an encapsulant 130 to expose upper surfaces of first and second interconnect structures 120B and 112B and a dummy structure 112T. By the grinding process, the upper surface of the encapsulant 130 may become planar, the upper surfaces of the first and second interconnect structures 120B and 112B and the dummy structure 112T may be exposed from the upper surface of the encapsulant 130.

Figure 17:
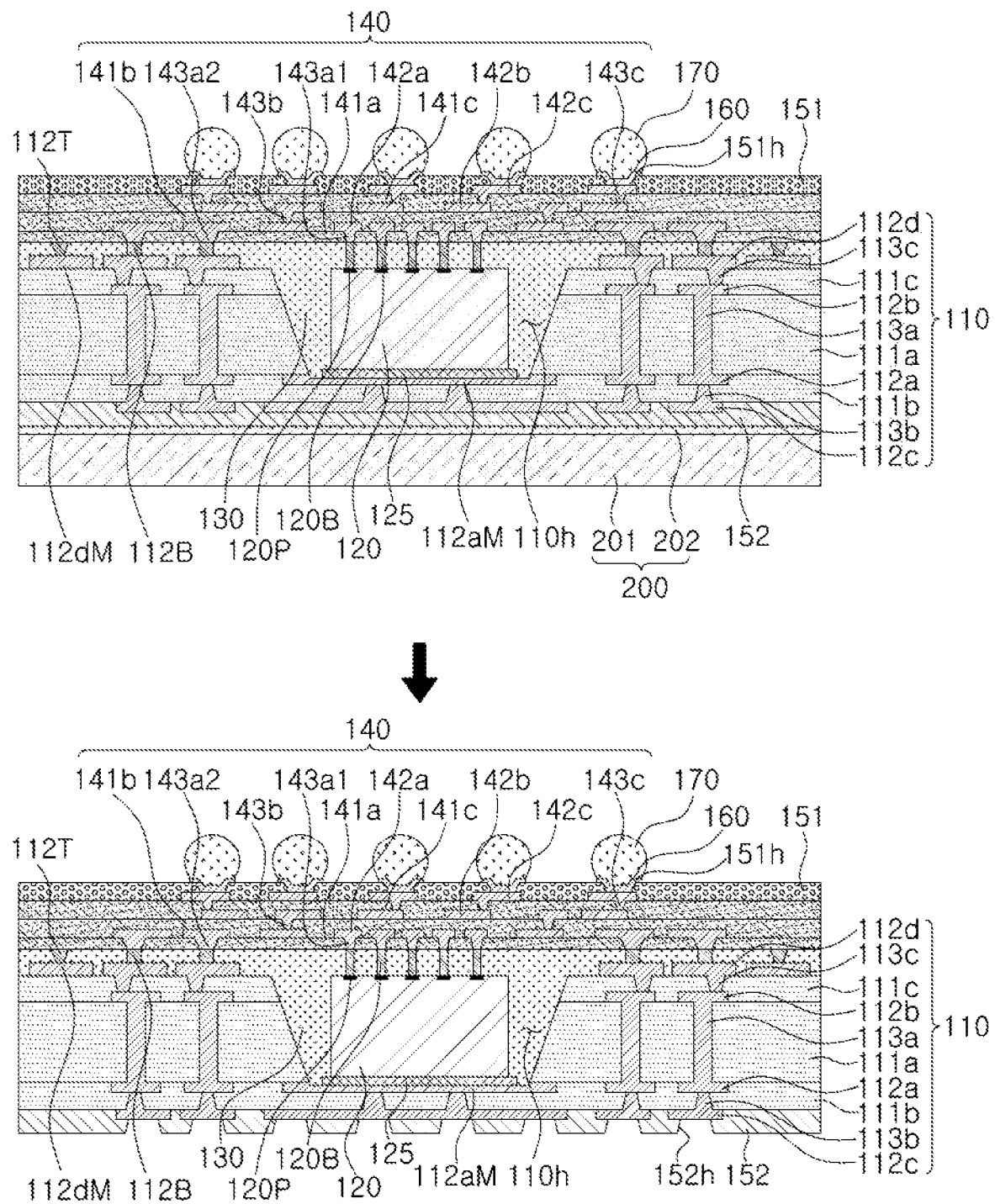

Referring to FIG. 17, a first insulating layer 141a may be formed by applying a PID on an encapsulant 130 and performing a curing process, and a first redistribution layer 142a and first connection vias 143a1 and 143a2 may be formed through a plating process. A via hole may be formed by a photolithography process using exposure and development. Second and third insulating layers 141b and 141c, second and third redistribution layers 142b and 142c, and second and third connection vias 143b and 143c may be formed to have greater number of layers in accordance with a design. A connection member 140 may be formed through a series of processes. A first passivation layer 151 may be formed by laminating ABF, and the like, on the connection member 140, and performing a curing process, and a carrier film 200 may be removed. An under bump metal layer 160 may be formed using a well-known metallization method, and an electrical interconnect structure 170 may be formed through a reflow process using a solder ball, and the like. The fan-out semiconductor package 100A described in the exemplary embodiment above may be manufactured through a series of processes.

Figure 18:
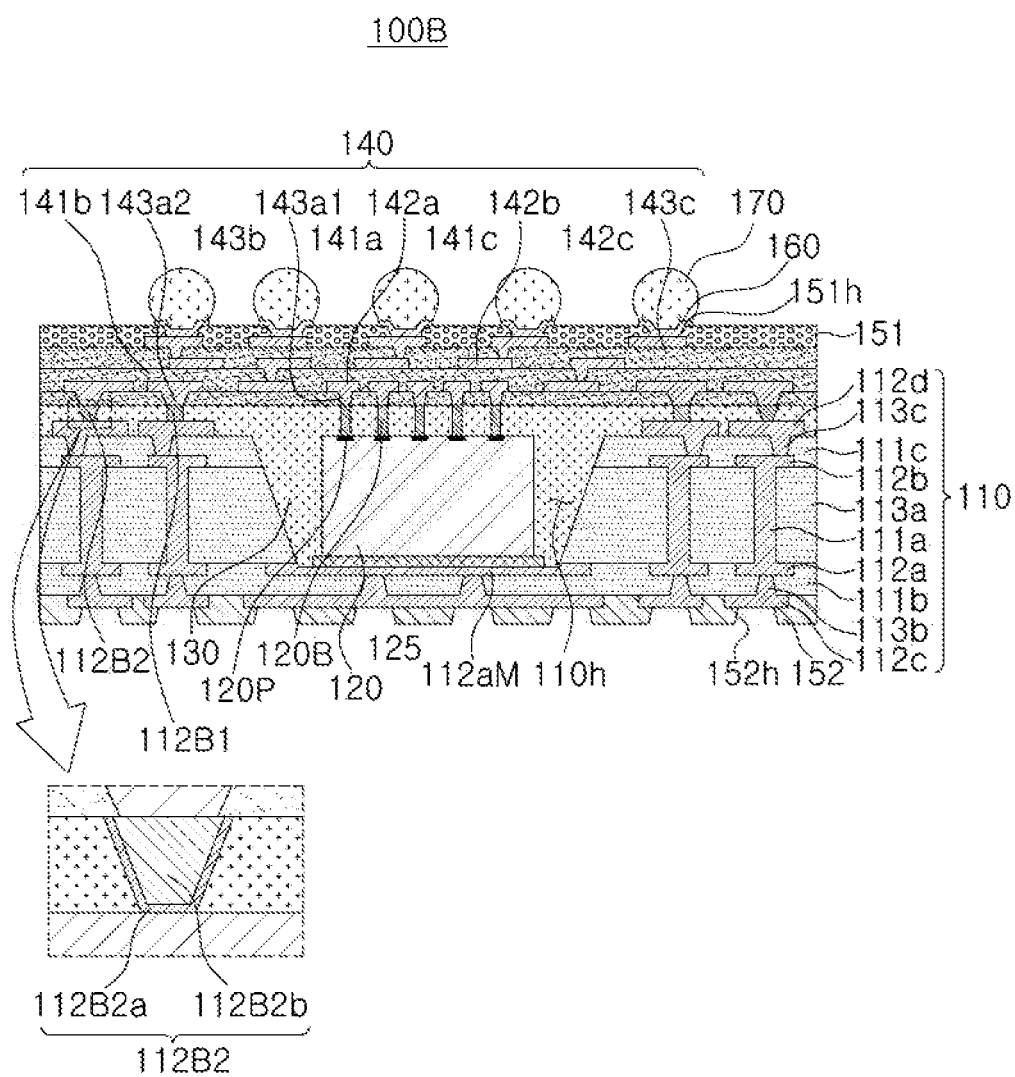
FIG. 18 is a schematic cross-sectional diagram illustrating another example of a fan-out semiconductor package.

FIG. 18 is a schematic cross-sectional diagram illustrating another example of a fan-out semiconductor package Referring to the diagram, in a fan-out semiconductor package 100B, at least one of interconnect structures 112B1 and 112B2 disposed on an outermost wiring layer 112d of a frame 110 may be configured to have a tapered shape, that is, configured to have sloped side surfaces, instead of disposing a dummy layer 112dM and a dummy structure 112T on an outermost portion of the frame 110, as compared to the fan-out semiconductor package 100A in the aforementioned exemplary embodiment. For example, the second interconnect structure 112B1 disposed on at least one pattern on the outermost wiring layer 112d of the frame 110 may be formed as a copper post or a copper pillar, and thus, the second interconnect structure 112B1 may be easily formed, and may be implemented to have approximately vertical side surfaces optimized for electrical connection. Further, a third electrical interconnect structure 112B2 disposed on at least another pattern on the outermost wiring layer 112d may be implemented to have sloped side surfaces such that a residual thickness may be measured. In other words, the third interconnect structure 112B2 may have side surfaces having a greater slope than a slope of the side surfaces of the second interconnect structure 112B1. That is, the third interconnect structure 112B2 may have a structure having advantages of both of the structures. The interconnect structure 112B2 having a tapered shape may include a seed layer 112B2a disposed on the side surfaces of the tapered interconnect structure 112B2 which is in contact with a surface of one of patterns on the outermost wiring layer 112d and an encapsulant 130, and a conductive layer 112B2b disposed on the seed layer 112B2a and filling an internal space formed by the seed layer 112B2a. The seed layer 112B2a may be a single layer formed of a copper (Cu) layer, or may be a double layer formed of a titanium (Ti) layer and a copper (Cu) layer, but an example of the seed layer 112B2a is not limited thereto. The conductive layer 112B2b may be a single layer formed of a copper (Cu) layer, but an example of the conductive layer 112B2b may not be limited thereto. The descriptions of the other elements may be the same as the descriptions described with reference to FIGS. 9 to 17 above, and thus, the detailed descriptions thereof will not be repeated.

According to the aforementioned exemplary embodiments, the fan-out semiconductor package configured such that a semiconductor chip may be disposed using the frame including the recessed portion having a blind form, and accordingly, when a grinding process is used, a residual thickness of the interconnect structure electrically connecting a wiring of the frame and/or a connection pad of the semiconductor chip to a redistribution layer may be measured, may be provided. Thus, it may be easy to set conditions of a grinding process, defects caused by over-grinding may be reduced, and it may not be necessary to use a high-priced measuring device.

In the exemplary embodiments, the expression "coplanar" may indicate that elements may be positioned on the exact same level, but may also indicate that elements may be substantially positioned on the same level as a result of a grinding process, and the like.

In the exemplary embodiments, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The terms may be defined as above for ease of description, and the scope of right of the exemplary embodiments is not particularly limited to the above terms.

In the exemplary embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the exemplary embodiments.

In the exemplary embodiments, the term "exemplary embodiment" may not refer to one same exemplary embodiment, but may be provided to describe and emphasize different unique features of each exemplary embodiment. The above suggested exemplary embodiments may be implemented do not exclude the possibilities of combination with features of other exemplary embodiments. For example, even though the features described in one exemplary embodiment are not described in the other exemplary embodiment, the description may be understood as relevant to the other exemplary embodiment unless otherwise indicated.

The terms used in the exemplary embodiments are used to simply describe an exemplary embodiment, and are not intended to limit the present disclosure. A singular term includes a plural form unless otherwise indicated.

While the exemplary embodiments have been shown and described above, it will be apparent to those skilled in the art that modifications and variations could be made without departing from the scope of the present invention as defined by the appended claims.

What is claimed is:

1. A fan-out semiconductor package, comprising:
a frame comprising a plurality of wiring layers electrically connected to one another, and a dummy layer disposed on the same level as a level of an outermost wiring layer among the plurality of wiring layers, and having a recessed portion including a stopper layer disposed on a bottom surface of the recessed portion;
a semiconductor chip having an active surface on which a connection pad is disposed and an inactive surface opposing the active surface, and disposed in the recessed portion such that the inactive surface opposes the stopper layer;
a first interconnect structure disposed on the connection pad;
a second interconnect structure disposed on the outermost wiring layer;
a dummy structure disposed on the dummy layer;
an encapsulant encapsulating at least portions of the frame, the semiconductor chip, the first interconnect structure, the second interconnect structure, and the dummy structure, and filling at least a portion of the recessed portion; and
a connection member disposed on the frame and on the active surface of the semiconductor chip, and comprising a redistribution layer electrically connected to first and second metal bumps,
wherein the dummy structure has sloped side surfaces.

2. The fan-out semiconductor package of claim 1, wherein the dummy structure is electrically insulated from the first interconnect structure and the second interconnect structure.

3. The fan-out semiconductor package of claim 1, wherein the dummy structure has a top surface being in contact with an insulating material of the connection member.

4. The fan-out semiconductor package of claim 1, wherein the dummy layer and the dummy structure are disposed in an outermost portion of the frame.

5. The fan-out semiconductor package of claim 1, wherein the dummy layer and the dummy structure each comprise a metal material.

6. The fan-out semiconductor package of claim 5,
wherein the dummy structure comprises a seed layer in contact with a surface of the dummy layer and the encapsulant, and a conductive layer disposed on the seed layer and filling an internal space provided by the seed layer, and
wherein the conductive layer is physically spaced part from the encapsulant.

7. The fan-out semiconductor package of claim 5, wherein at least one of the plurality of wiring layers comprises a ground, and the dummy layer and the dummy structure are electrically connected to the ground.

8. The fan-out semiconductor package of claim 1, wherein the first and second interconnect structures are metal posts.

9. The fan-out semiconductor package of claim 8, wherein side surfaces of each of the metal posts extends substantially vertically with respect to an upper surface of the encapsulant.

10. The fan-out semiconductor package of claim 1, wherein the first and second interconnect structures and the dummy structure are buried in the encapsulant such that top surfaces of the first and second interconnect structures and the dummy structure are exposed from the encapsulant.

11. The fan-out semiconductor package of claim 10, wherein the first and second interconnect structures, the dummy structure, and the encapsulant have top surfaces coplanar with one another.

12. The fan-out semiconductor package of claim 10, wherein the connection member comprises an insulating layer disposed on the encapsulant, first and second connection vias penetrating through the insulating layer and respectively in contact with the first and second interconnect structures, and the redistribution layer disposed on the insulating layer and electrically connected to the first and second interconnect structures through the first and second connection vias.

13. The fan-out semiconductor package of claim 1,
wherein the frame comprises a core insulating layer, a first built-up insulating layer having one or more layers and disposed in a lower portion of the core insulating layer, a second built-up insulating layer having one or more layers and disposed in an upper portion of the core insulating layer, a first connection via layer penetrating through the core insulating layer, a second connection via layer having one or more layers and penetrating through the first built-up insulating layer, and a third connection via layer having one or more layers and penetrating through the second built-up insulating layer,
wherein the plurality of wiring layers are disposed on the core insulating layer and the first and second built-up insulating layers and electrically connected to one another through the first to third connection via layers,
wherein the core insulating layer has a thickness greater than thicknesses of the first and second built-up insulating layers, and
wherein a connection via of the second connection via layer and a connection via of the third connection via layer are tapered in opposite directions.

14. The fan-out semiconductor package of claim 1,
wherein the recessed portion has a sloped wall, and
wherein the inactive surface of the semiconductor chip is attached to the stopper layer by an attachment member.

15. The fan-out semiconductor package of claim 1, wherein the stopper layer is a metal layer, at least one of the plurality of wiring layers comprises a ground, and the metal layer is electrically connected to the ground.

16. The fan-out semiconductor package of claim 1, wherein at least one of the plurality of wiring layers is disposed in a position lower than the stopper layer.

17. A fan-out semiconductor package, comprising:
a frame comprising a plurality of wiring layers electrically connected to one another, and having a recessed portion including a stopper layer disposed on a bottom surface of the recessed portion;
a semiconductor chip having an active surface on which a connection pad is disposed and an inactive surface opposing the active surface, and disposed in the recessed portion such that the inactive surface opposes the stopper layer;
a first interconnect structure disposed on the connection pad;
a second interconnect structure disposed on at least one pattern on an uppermost wiring layer among the plurality of wiring layers;
a third interconnect structure disposed on at least the other pattern on the uppermost wiring layer among the plurality of wiring layers;
an encapsulant encapsulating at least portions of the frame, the semiconductor chip, the first to third interconnect structures, and filling at least a portion of the recessed portion; and
a connection member disposed on the frame and the active surface of the semiconductor chip, and comprising a redistribution layer electrically connected to first and second metal bumps,
wherein the third interconnect structure has side surfaces having slopes greater than slopes of side surfaces of the second interconnect structure.

\* \* \* \* \*